United States Patent [19]

Byington et al.

[11] Patent Number: 4,713,794

[45] Date of Patent: Dec. 15, 1987

[54] DIGITAL MEMORY SYSTEM

[75] Inventors: Roy E. Byington, Sudbury; William M. Pease, Weston, both of Mass.

[73] Assignee: Raytheon Company, Lexington, Mass.

[21] Appl. No.: 350,932

[22] Filed: Feb. 22, 1982

Related U.S. Application Data

[62] Division of Ser. No. 972,594, Dec. 22, 1978, Pat. No. 4,318,182.

[51] Int. Cl.⁴ .............................................. G11C 27/00
[52] U.S. Cl. ........................................ 365/45; 364/602
[58] Field of Search ........................... 365/45; 364/602

[56] References Cited

U.S. PATENT DOCUMENTS

| | | | |
|---|---|---|---|
| 3,461,381 | 8/1969 | Nelson et al. | 365/45 |
| 3,749,837 | 7/1973 | Doughty | 179/1 J |
| 3,810,126 | 5/1974 | Butler et al. | 365/45 |
| 3,947,827 | 3/1976 | Dautremont, Jr. et al. | 365/45 |
| 3,969,705 | 7/1976 | Waggener | 365/45 |

*Primary Examiner*—Joseph A. Popek
*Attorney, Agent, or Firm*—Richard M. Sharkansky

[57] ABSTRACT

A digital memory system is described wherein a plurality of digital storage sections are simultaneously fed by an analog signal. Each storage section is adapted to store a sample of such analog signal in response to a pulse. Trains of pulses are fed to the storage sections, the pulses in each train being displaced in time from a succeeding train an amount T/n where n is the number of storage sections and T is related to the bandwidth of the analog signal.

9 Claims, 25 Drawing Figures

FIG. 4A CP/2 LINE 
FIG. 4B BIT STORED IN INPUT SHIFT REG. 52 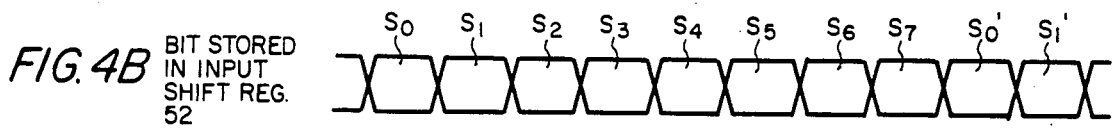
FIG. 4C ST 1 LINE 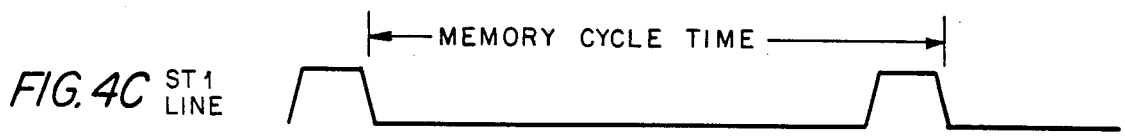
FIG. 4C' ST 2 LINE
FIG. 4D DATA INPUT TO RAM'S 56a, 56b 
FIG. 4E ADR. BUS 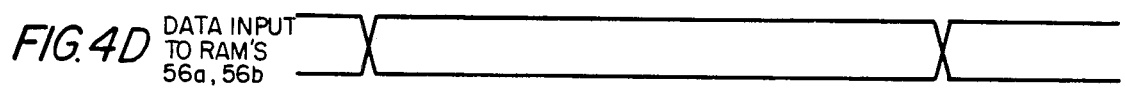
FIG. 4F R/W LINE 
FIG. 4G BIT READ FROM OUTPUT SHIFT REG. 58 
FIG. 4H MXC LINE 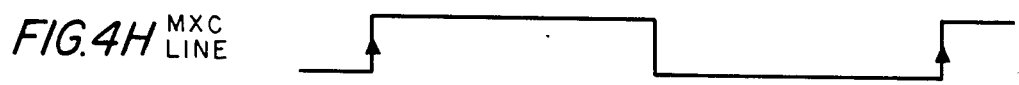

FIG. 7A  CP LINE 
FIG. 7B  $\overline{CP}$ LINE 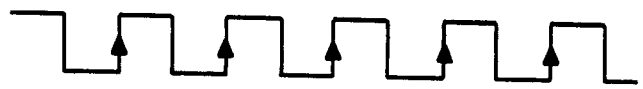
FIG. 7C  LINE CP/2 TO MEMORY MODULE 48a 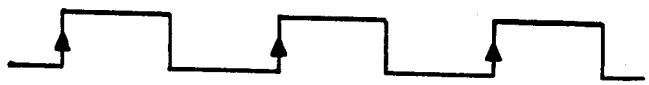
FIG. 7D  LINE $\overline{CP/2}$ TO MEMORY MODULE 48b 
FIG. 7E  LINE CP/2 + 90° TO MEMORY MODULE 48c 
FIG. 7F  LINE $\overline{CP/2 + 90°}$ TO MEMORY MODULE 48d 
FIG. 7G  EFFECTIVE SAMPLING RATE 
FIG. 7H  MEMORY MODULE COUPLED TO LINE 230 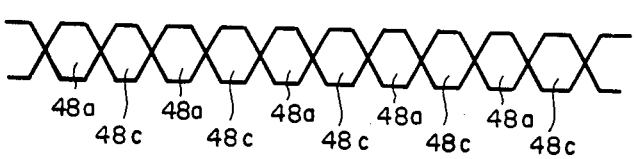
FIG. 7I  MEMORY MODULE COUPLED TO LINE 233 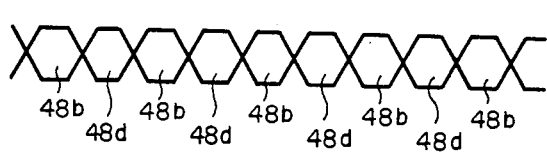
FIG. 7J  LINE COUPLED TO LINE 212 
FIG. 7K  MEMORY MODULE COUPLED TO LINE 212 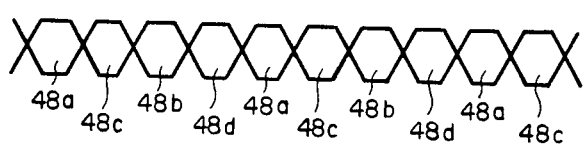

DIGITAL MEMORY SYSTEM

CROSS-REFERENCE TO RELATED APPLICATIONS

This is a division of application Ser. No. 972,594, filed Dec. 22, 1978, now U.S. Pat. No. 4,318,183.

BACKGROUND OF THE INVENTION

This invention relates generally to digital memory systems and more particularly to digital memory systems which are adapted to store radio frequency signals and to enable subsequent retransmission of such signals.

As is known in the art, it is frequently desired to store a received radio frequency signal and later retransmit such signal. In one such system, the received radio frequency signal is periodically sampled at or above the Nyquist frequency, each sample is next converted into a corresponding digital word, and each digital word is then stored in a digital memory. When it is desired to retransmit, the stored digital words are sequentially read from the memory, generally in the sequence in which they were stored, and such digital words are converted into corresponding voltages to produce a radio frequency signal which is amplified and retransmitted.

With such arrangement, the degree to which the retransmitted radio frequency signals resemble the received radio frequency signals is related, inter alia, to the sampling rate and the bandwidth of the signal being sampled. That is, as the bandwidth of the received signal increases the sampling rate of such received signal must correspondingly increase to satisfy the Nyquist frequency criterion. The bandwidth of the received signal, therefore, is limited, inter alia, by the operating rate of the sampling and digital processing components used in the digital memory system.

SUMMARY OF THE INVENTION

In accordance with the present invention, a digital memory system includes a plurality of digital storage means, each one being simultaneously fed by an analog signal, and each one being adapted to store samples of the analog signal fed thereto in response to pulses; and, means for producing a plurality of trains of the pulses, the pulses in each one of the trains having a period, T, each one of such trains of the pulses being fed to a corresponding one of the plurality of storage means, the pulses in successive trains thereof being displaced in time T/m where m is an integer greater than one.

In a preferred embodiment of the invention, the analog signal has a frequency within a bandwidth $\Delta f$. The period T of the pulses is related to the bandwidth. In particular, if there are n digital storage means, the period T is $n/2\Delta f$. Further, the pulses in successive trains are displaced in time T/n. Therefore, the pulse repetition frequency of each train of pulses is $2\Delta f/n$. Therefore, for n greater than one, the pulse repetition frequency of the train of pulses is less than twice the bandwidth of the analog signal, thereby allowing processing components in each digital storage means to operate at rates less than that required where a single storage means is used.

BRIEF DESCRIPTION OF THE DRAWINGS

The foregoing features of this invention, as well as the invention itself, may be more fully understood from the following detailed description read together with the accompanying drawings, in which:

FIGS. 4A–4H are timing diagrams useful in understanding the operation of the digital radio frequency memory system of FIG. 2;

FIGS. 7A–7K are timing diagrams useful in understanding the operation of the digital radio frequency memory of FIG. 2.

DESCRIPTION OF THE PREFERRED EMBODIMENTS

Figure 1:
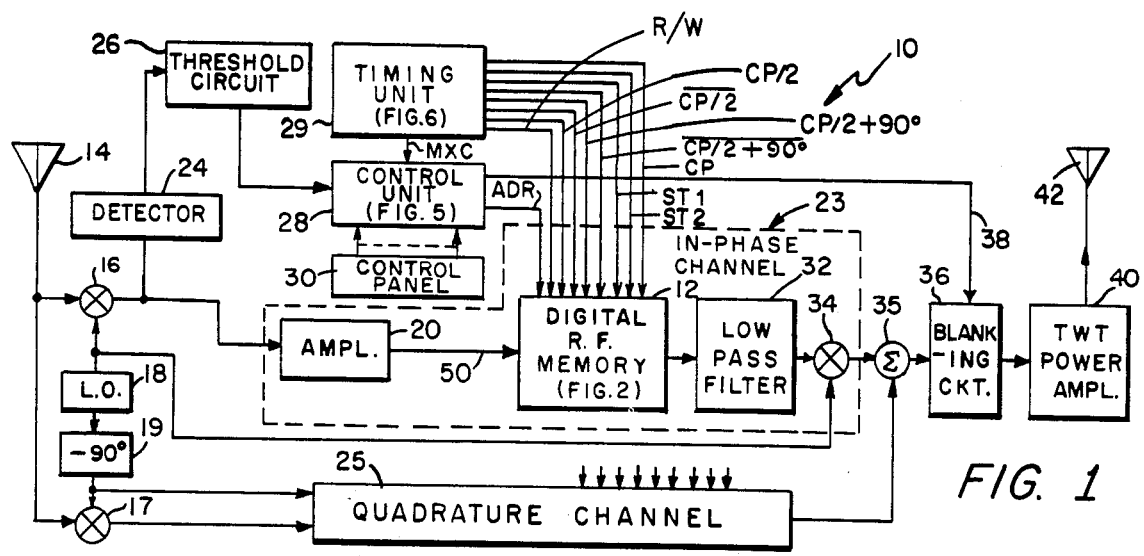
FIG. 1 is a block diagram of a radio frequency digital memory system having a digital radio frequency memory according to the invention.

Referring now to FIG. 1, a radio frequency signal receiver/transmitter system 10 is shown. Such system 10 includes a digital RF memory 12, the details of which will be described in connection with FIG. 2. Suffice it to say, however, that such digital RF memory 12 is adapted to store digital samples of incoming radio frequency signals such as pulses from a radar transmitter. The radio frequency signal receiver/transmitter 10 includes a radio frequency antenna 14, a pair of mixers 16, 17, a local oscillator 18, and a 90° phase shifter 19, all of conventional design and arranged as shown to heterodyne the incoming radio frequency signals having carrier frequencies within a predetermined frequency band of interest, here $f_c \pm 250$ MHz (where $f_c$ is the center frequency of the operating band, typically several GHz), to baseband frequency signals. It is noted that the local oscillator 18 frequency is also $f_c$. The baseband signals are fed to an in-phase channel 23 and a quadrature channel 25, as shown. The channels 23, 25 are identical in construction, the in-phase channel 23 being shown in detail.

As shown, in-phase channel 23 includes an amplifier 20, here having the same 250 MHz bandwidth as the base band signals. The output of mixer 16, in addition to being fed to amplifier 20, is fed to a conventional diode detector 24 and threshold circuit 26, as shown. In response to the presence of an incoming signal, the output of the threshold circuit 26 provides a binary control signal indicative of the presence or absence of an incoming signal. The control signal produced at the output of the threshold circuit 26 is fed to a control unit 28, the details of which will be described in connection with FIG. 5. Suffice it to say here, however, that in response to the control signal produced at the output of threshold circuit 26, and to other signals to be described fed to the control unit 28 via a control panel 30 (or, alternatively, a digital computer), and a timing unit 29 in a manner to be described in detail in connection with FIG. 6, digital samples of the radio frequency signal passed to the digital RF memory 12 from the amplifier 20 become sequentially stored in the digital RF memory 12, and digital samples previously stored in such digital RF memory 12 become sequentially read therefrom. The sequence of digital samples read from the digital RF memory 12 in response to control signals supplied thereto from the timing unit 29 and control unit 28, in a manner to be described, is passed to a low pass filter 32, as shown. The filtered signals represent an RF signal to be transmitted, but at baseband. Such signal is up-converted from baseband to a radio frequency signal within the predetermined frequency band of interest by heterodyning the filtered signal with the local oscillator signal produced by local oscillator 18, in a conventional mixer 34, as shown. The output of mixer 34 is combined with the signals produced by quadrature channel 25 in a summing network 35, and the combined signals are then fed to a blanking circuit 36, here a conventional gated amplifier, as shown. In response to a control signal supplied to the blanking circuit 36 from the control unit 28 via line 38, in a manner to be described, the up-converted signal produced at the output of mixer 34 is either passed or inhibited from passing to a conventional TWT power amplifier 40, as shown, for reasons to become apparent hereinafter. Suffice it to say here, however, that up-converted signals passed through blanking circuit 36 in response to a control signal fed thereto via line 38 are amplified and transmitted via transmitting antenna 42.

Figure 2:
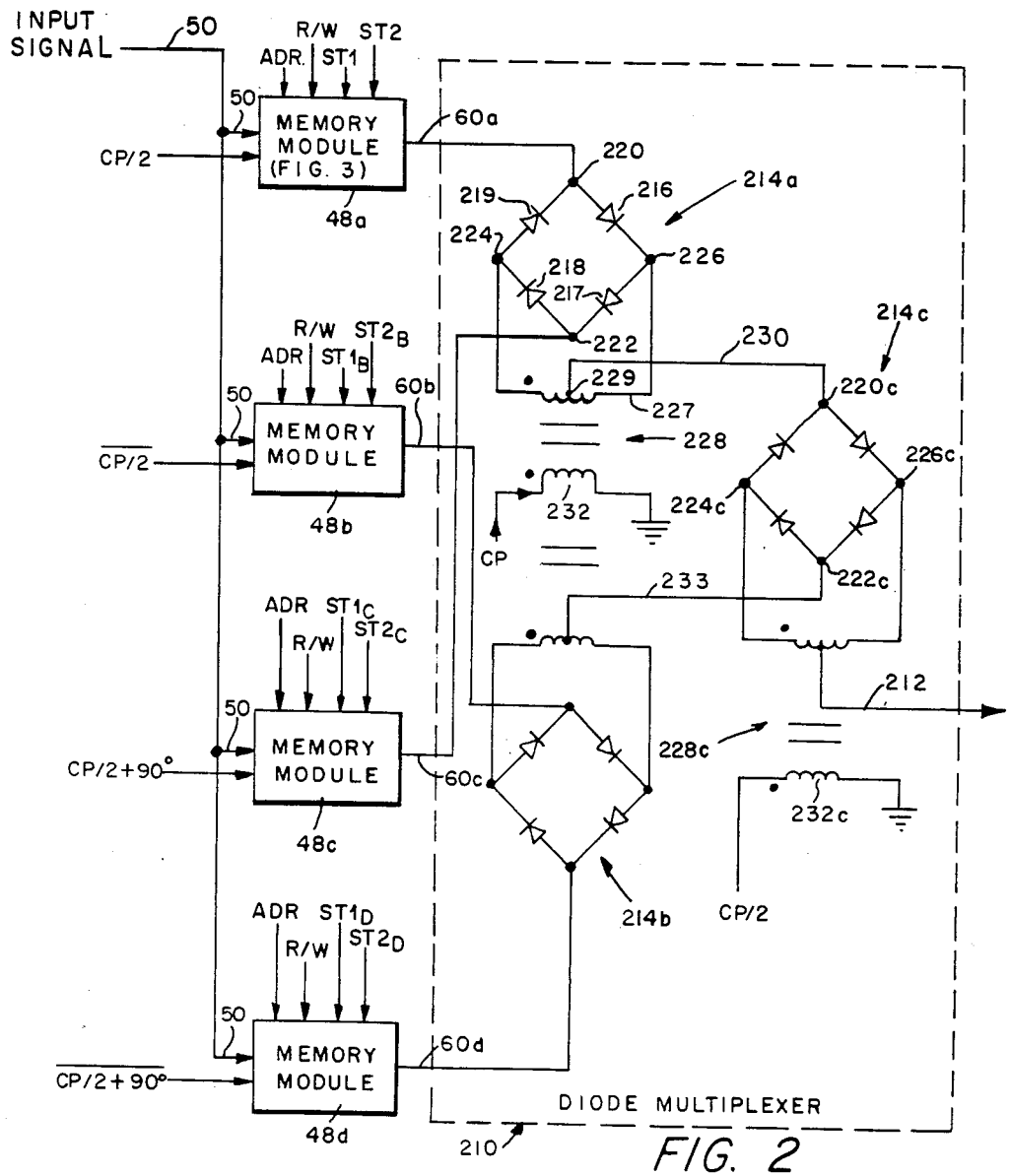
FIG. 2 is a block diagram of the digital radio frequency memory used in the system of FIG. 1.
Figure 3:
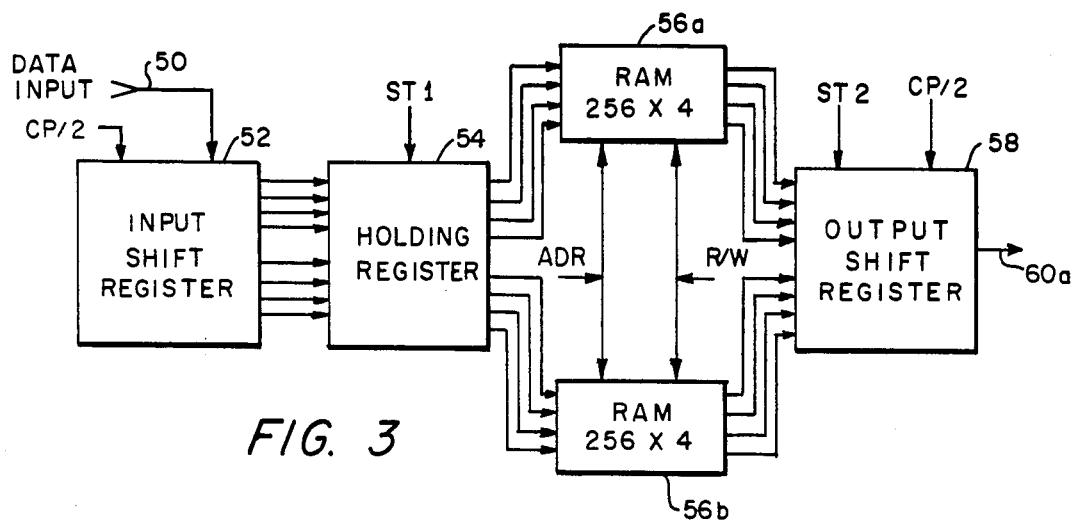
FIG. 3 is a block diagram of a memory module used in the digital radio frequency memory of FIG. 2.
Figure 6:
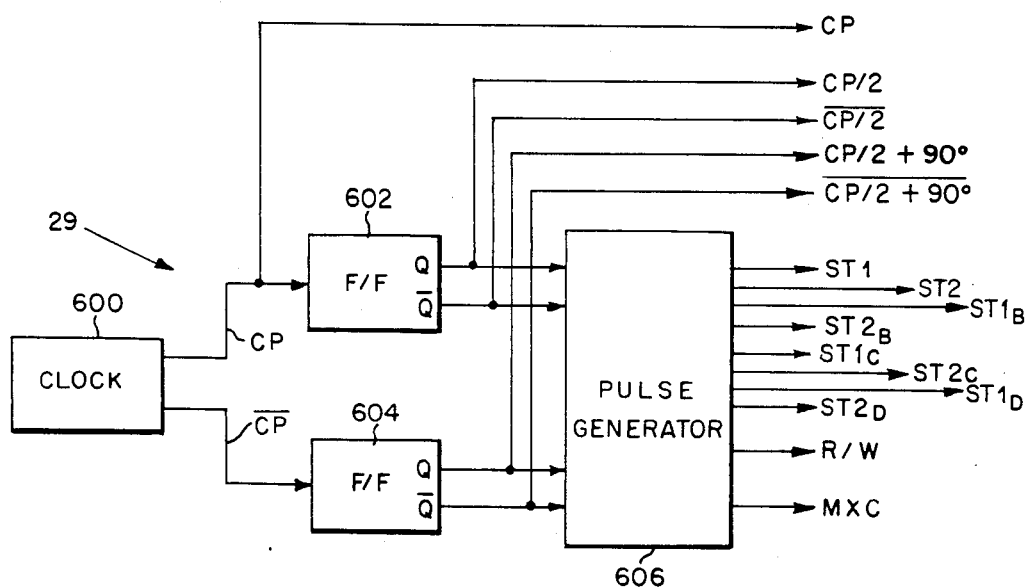
FIG. 6 is a block diagram of a timing unit used to control the control unit of FIG. 5 and the memory of FIG. 2.

Referring now to FIG. 2, digital RF memory 12 is shown to include a plurality of, here four, memory modules 48a–48d, each fed by the output of RF amplifier 20 (FIG. 1) via input line 50, as shown. Each one of the memory modules 48a–48d is identical in construction, an exemplary one thereof, here memory module 48a, being shown in detail in FIG. 3. As shown in FIG. 3, memory module 48a includes an input shift register 52, here an eight-bit emitter-coupled logic (ECL) shift register (Part No. 100141 manufactured by Fairchild Camera and Instrument Company, Mountain View, Calif., adapted to store a sample of the baseband radio frequency signal fed thereto via input line 50 in response to the leading edge of each one of the clock pulses fed to such shift register 52 via line CP/2, such clock pulses here having a pulse repetition frequency (PRF) of one-half of the bandwidth of the signals fed to the digital RF memory 12 from amplifier 20 (FIG. 1) here 125 MHz and are shown in FIG. 4A. As will be discussed hereinafter, such pulses are produced within the digital RF memory 12 in response to clocking signals supplied to such digital RF memory 12 from timing unit 29 (FIG. 6). It is noted that the baseband radio frequency signal fed to shift register 52 is a bipolar signal having sufficient gain and d-c level so that, in response to the leading edge of each one of the clock pulses fed to such shift register 52 via input line 50, a logical one becomes stored in such shift register 52 if the level of such bipolar signal is greater than the switching threshold of the shift register 52, and a logical zero becomes stored in such shift register 52 if the level of such bipolar signal is less than (or equal to) the switching threshold of the shift register 52. In this way, one-bit quantized samples become sequentially stored as digital signals in the input shift register 52 in response to the sequence of clock pulses fed thereto via line CP/2. Each one of the eight stages of input shift register 52 is coupled to a corresponding one of eight storage stages of an eight-bit holding register 54, as shown. After eight samples are stored in the input shift register 52, the stored samples are loaded, in parallel, into the eight-bit holding register 54 in response to a pulse fed to such holding register 54 from the timing unit 29 (FIG. 1) via line ST1. That is, referring also to FIG. 4B, in response to the leading edge of each one of the clock pulses on line CP/2 (FIG. 4A), a one-bit quantized sample of the radio frequency signal becomes stored in the input shift register 52 (FIG. 3) as either a logical one or a logical zero (FIG. 4B). After a set of eight successive samples $S_0$–$S_7$ have been stored in such input shift register 52 (FIG. 3), the pulse on line ST1 (FIG. 4C) enables such eight samples $S_0$–$S_7$ to become simultaneously stored in holding register 54, and the process repeats. It is noted that the frequency of the pulses on line ST1 is one-eighth the frequency of the clock pulses on line CP/2, and the pulses on both such lines are generated from a common clock 600 by the timing unit 29 (FIG. 6) to be described.

It follows, then, that eight new samples are stored in holding register 54 in response to each pulse on line ST1, the period between successive pulses defining the memory cycle time of the memory module 48a. The output of holding register 54 is fed to a pair of random access memories (RAM's) 56a, 56b, here each one being a 256×4 bit RAM. In particular, four bits of the holding register 54 are fed as inputs to RAM 56a, and the remaining four bits of holding register 54 are fed as inputs to RAM 56b. Here such RAM's 56a, 56b are each part No. MB 7071 manufactured by Fujitsu, Ltd., Tokyo, Japan. The RAM's 56a, 56b are controlled by signals fed thereto from timing unit 29 and control unit 28 (FIG. 1) via an address (ADR) bus and a read/write (R/W) line. That is, referring to FIG. 4D, eight bits of data are fed to RAM's 56a, 56b from holding register 54 during a memory cycle time. A write address signal is supplied to the RAM's 56a, 56b from the control unit 28 (FIG. 1) via the ADR bus during the first half of the memory cycle time, and a read address signal is supplied to the RAM's 56a, 56b via the ADR bus during the second half of the memory cycle time (FIG. 4E) in a manner to be described. A read/write signal (R/W) is supplied to RAM's 56a, 56b via the R/W line from timing unit 29 (FIG. 6) as shown in FIG. 4F. It is noted that the RAM's 56a, 56b are placed in a write enable mode when the signal on the R/W line is here "low" and are placed in a read enable mode when such signal is here "high," and that a longer read time than write time is required for RAM's 56a, 56b. It is also noted, however, that, while the RAM's 56a, 56b are in the read enable mode for a relatively long time, the data is not actually read from the RAM's 56a, 56b until after a time delay called the "read access time" indicated in FIG. 4F. Valid data is available at the RAM outputs only during the time from the end of the "read access time" and the change of RAM address (FIG. 4E). This time is shown as "valid data" in FIG. 4E.

The data read from the RAM's 56a, 56b are fed to an output shift register 58 (FIG. 3), here an eight-bit shift register identical in design to the input shift register 52. The eight bits of data read from the RAM's 56a, 56b are loaded, in parallel to the eight stages of output shift register 58 in response to each pulse coupled thereto from the timing unit 29 (FIG. 6) via the ST2 line (FIG. 4C'). It follows, then, that the eight bits read from the RAM's 56a are simultaneously loaded into the output shift register 58 at the end of the memory cycle time. The eight bits of data loaded into the output shift register 58 are then sequentially read out of the output stage (i.e., the last stage) thereof, and the eight stored bits appear serially on output line 60a, in response to clock pulses fed to such output shift register 58 from timing unit 29 (FIG. 1) via the CP/2 line, as shown for streams of bits $S_A$–$S_A'$ in FIG. 4G. That is, the input and output shift registers 52, 58 continuously shift data stored therein in response to the same clock signals. In this way, a stream of samples of the radio frequency signal on line 50 is continuously inputted into the memory module 48a simultaneously as a stream of samples is outputted from such memory module 48a.

Figure 5:
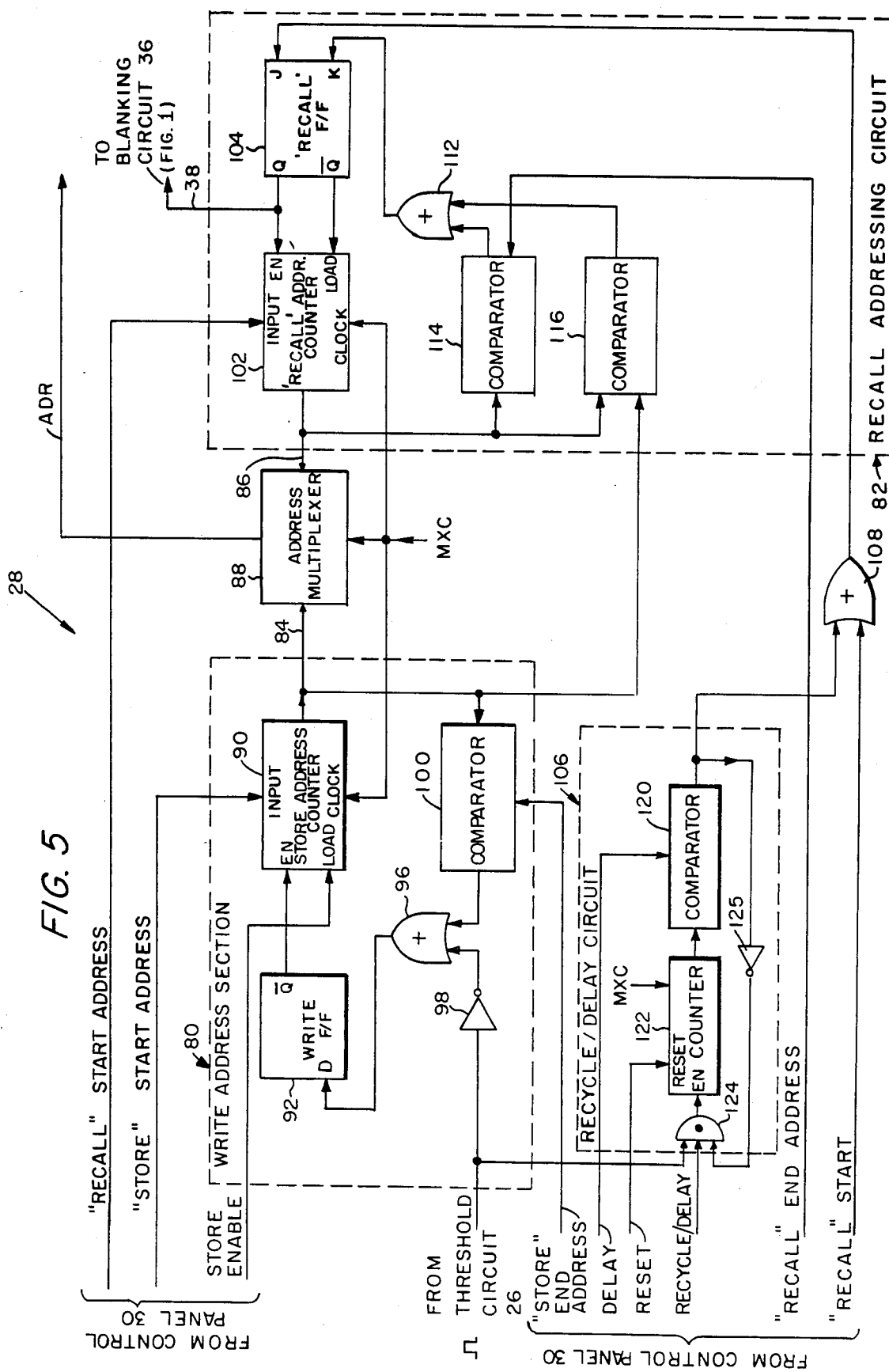
FIG. 5 is a block diagram of a control unit used to control the digital radio frequency memory of FIG. 2.

Referring now to FIG. 5, the details of the control unit 28 are shown. Such unit 28 produces the read/write addresses for the memory modules 48a-48d (FIGS. 2 and 3) via the ADR bus and the control signal for the blanking circuit 36 (FIG. 1) via line 38 in response to: (a) a control signal produced on line MXC by timing unit 29 (FIG. 6) and shown in FIG. 4H; (b) a control signal produced by the threshold circuit 26 (FIG. 1); and (c) a plurality of input signals fed to the control unit 28 from control panel 30 (or a digital computer), such signals being:

(1) "RECALL" START ADDRESS—an eight-bit digital word indicating the first or starting address in a sequence of addresses to be read or "recalled" from RAM's 56a, 56b (FIG. 3);

(2) "STORE" START ADDRESS—an eight-bit digital word indicating the first or starting address in a sequence of addresses to be written into or "stored" in RAM's 56a, 56b;

(3) "STORE" END ADDRESS—an eight-bit digital word indicating the last address in the sequence of addresses where data can be written into RAM's 56a, 56b;

(4) "RECALL" END ADDRESS—an eight-bit digital word indicating the last address in the sequence of addresses where data can be read or recalled from RAM's 56a, 56b;

(5) "STORE" ENABLE—a one-bit control signal which, when produced, enables samples of a detected incoming signal to be stored in sequential addresses of RAM's 56a, 56b, the starting address in such sequence being indicated by the eight-bit digital word "STORE" START ADDRESS, and such sequence ending on either the address specified by the "STORE" END ADDRESS or the loss of a detected incoming signal;

(6) "RECALL" START—a one-bit digital signal which, when high, enables a sequence of binary signals to be sequentially read from RAM's 56a, 56b, the starting address in such sequence being specified by the eight-bit digital word "RECALL" START ADDRESS, such sequence ending on the address specified by the "RECALL" END ADDRESS or the last address in which stored data is written (indicating that the end of a stored signal has been reached);

(7) "RECYCLE/DELAY"—a one-bit digital signal which, when high, enables samples of a detected incoming signal to be read from the digital RF memory 12 (FIG. 1) but delayed in time; and (8) DELAY—an eight-bit digital word representative of the time delay desired in connection with the RECYCLE/DELAY mode specified above in connection with item (7).

It is first noted that the control unit 28 may be considered as having two addressing sections, a write addressing section 80 and a recall (or read) addressing section 82. The addresses produced by such addressing sections are eight-bit digital words produced on buses 84, 86, respectively. Such buses 84, 86 are fed to a conventional multiplexer 88, as shown. The multiplexer 88 alternatively couples either the write addressing signal on line 84 or the recall addressing signal on line 86 to the addressing ADR bus in accordance with the signal on the MXC line fed to the multiplexer 88 from the timing unit 29. In particular, when the signal on the MXC line is here "high," during the write address portion of the memory cycle time as shown in FIG. 4H, the write address on line 84 is coupled to the address ADR bus as shown in FIG. 4E; and, when the pulse on the MXC line is here "low," during the read address portion of the memory cycle time as shown in FIG. 4H, the read or recall address on bus 86 is coupled to the address ADR bus, as shown in FIG. 4E. That is, during the first half of each memory cycle time the write address on bus 84 provides the address for all the RAM's 56a, 56b in each of the memory modules 48a-48d of the digital RF memory 12 (FIGS. 2 and 3), and during the second, later half of each memory cycle time the read or recall data on bus 86 provides the address for each of such RAM's 56a, 56b.

Considering first the write addressing section 80, such section 80 is shown to include a store address counter 90, here any conventional digital counter adapted to count the trailing edges of pulses fed to the clock terminal thereof, here via the MXC line in response to a high signal fed to the enable EN terminal of such counter 90 via the $\overline{Q}$ output of a conventional D-type flip/flop 92, as shown, and to store or load an eight-bit digital word fed to the INPUT terminal of counter 90, here the "STORE" START ADDRESS, in response to the "STORE" ENABLE signal fed to the LOAD terminal of counter 90, as shown. The signal produced at the output $\overline{Q}$ is high when flip/flop 92 is in a "reset" condition, and the signal produced at output $\overline{Q}$ is low when flip/flop 92 is in a "set" condition.

Flip/flop 92 is placed in a set condition by a high signal fed to the "D" terminal thereof and is placed in a reset condition by a "low" signal fed to the same "D" terminal. In response to a "STORE" ENABLE signal, the store address counter 90 stores the "STORE" START ADDRESS fed to its INPUT terminal. Such stored address is fed to a comparator 100 along with the "STORE" END ADDRESS. This address would generally be greater then the "STORE" START ADDRESS. When the two addresses fed to comparator 100 are unequal, a low signal is produced at the output of comparator 100. When a pulse is detected from threshold circuit 26, such signal is inverted from a high signal to a low signal by inverter 98. The signal produced by OR gate 96 is fed to the "D" terminal of the flip/flop 92. Generally, when the memory is not storing, a store counter 90 stores the "STORE" END ADDRESS for reasons to become apparent. Hence, comparator 100 produces a high signal to set flip/flop 92, preventing counter 90 from counting pulses on line MXC. This is true regardless of the condition of the threshold circuit 26 output. Prior to receipt of a signal to be stored, a "STORE" ENABLE pulse is fed to the memory causing the "STORE" START ADDRESS to be loaded into counter 90. Hence, when a pulse is now detected, a low signal is produced at the output of inverter 98 and a low signal is initially produced at the output of comparator 100 because the START and END addresses are different. The low signal produced by OR gate 96 places the flip/flop 92 in a reset condition and terminal $\overline{Q}$ goes high to enable the counter 90 to count the pulses on line MXC. Such counter 90 continues to count until the address stored therein reaches the "STORE" END ADDRESS, at which time the output of comparator 100 goes high placing the flip/flop 92 in a set condition, placing terminal $\bar{Q}$ low and disabling the counting of counter 90.

The "STORE" START ADDRESS and the "STORE" END ADDRESS define a block of memory addresses available to store a particular received signal. It should be noted that, in the interval between the "STORE" ENABLE pulse and the time the threshold signal goes high, the store address counter 90 is held at the loaded "STORE" START ADDRESS. This is the first address of a block of addresses assigned to a particular signal, for example. The block size is arbitrary. The RAM's 56a, 56b (FIG. 3) continuously erase and re-write new information at this single "STORE" START ADDRESS. Receipt of a threshold signal and a "STORE" ENABLE signal causes the store address counter 90 to advance immediately, leaving the information most recently stored in the first address intact. Because the high speed portion of the memory modules 48a–48d is always running, the requirement for extreme threshold circuit response speed is reduced. The pulse width jitter produced by this asynchronous process is small because of the short memory cycle time.

Considering now the recall (or read) addressing section 82, is should be noted that such section 82 operates much like the write addressing section 80. Here, a recall address counter 102 (similar in construction to store address counter 90 except that it increments on the leading edge rather than the trailing edge of the pulses on line MXC) feeds read addressing signals to address multiplexer 88. In response to here a "high" signal on the LOAD terminal of counter 102, the "RECALL" START ADDRESS fed to the INPUT terminal of such recall address counter 102 becomes loaded in such counter 102. In response to here a "high" signal on the enable EN terminal of recall address counter 102, the contents of such counter increment in response to the leading edge of each pulse on the MXC line (FIG. 4H). The enable EN terminal and the LOAD terminal of recall address counter 102 are coupled to the Q and $\bar{Q}$ output terminals of a J-K "recall" flip/flop 104, as shown. When the J-K flip/flop 104 is placed in a set condition, as by here a "high" signal on the J terminal thereof, the output Q thereof goes "high" and the output $\bar{Q}$ goes "low," thereby enabling recall address counter 102 to increment in response to the leading edges of pulses on the MXC line. Conversely, when the J-K flip/flop 104 is placed in a reset condition by a "high" signal on the K terminal thereof, output terminal Q goes "low" and terminal $\bar{Q}$ goes high, thereby causing recall address counter 102 to load the "RECALL" START ADDRESS. When flip/flop 104 is in a reset condition, the "RECALL" START ADDRESS produced by the control panel 30 becomes loaded into the recall address counter 102. During this condition (that is, when recall is not required) the recall address counter 102 is held at the "RECALL" START ADDRESS, and the memory modules 48a–48d (FIGS. 2 and 3) continue to produce a sequence of the same binary signal stored at this address. The output Q of the recall flip/flop 104 is fed to the blanking circuit 36 (FIG. 1) via line 38. As discussed, when no recall is required, the output Q is low and, hence, a low signal is produced on line 38. This low signal disables the blanking circuit 36 and inhibits signals fed thereto from mixer 34 (FIG. 1) from passing to the TWT power amplifier 40; hence, no signals are transmitted. (As will be discussed, when recall is required the flip/flop 104 (FIG. 5) is placed in a set condition and the signal one line 38 goes "high," thereby enabling the blanking circuit 36 (FIG. 1) to pass signals produced at the output of mixer 34 (FIG. 1) to the TWT power amplifier for transmission.

When recall is requested, a "high" signal is produced by the control panel 30 on the "RECALL" START line (or by the recycle/delay circuit 106, in a manner to be described), thereby producing a "high" signal at terminal J of the recall flip/flop 104, placing such flip/flop 104 in a set condition. Line 38 goes high enabling the blanking circuit 36, as described above, and the recall address counter 102 increments from the loaded "RECALL" START ADDRESS in response to the leading edge of each pulse on the MXC line (FIG. 4A). The recall address counter 102 continues to increment until it either reaches the same address stored in the store address counter 90 (indicating that the end of the stored pulse is reached) or until the recall address counter 102 reaches the "RECALL" END ADDRESS supplied by the control panel 30. In particular, a pair of comparators 114, 116 have outputs coupled to the K terminal of the recall flip/flop 104 through OR gate 112, as shown. Comparator 114 is fed by the output of recall address counter 102 and the "RECALL" END ADDRESS. Comparator 116 is fed by the store address counter 90 and the recall address counter 102. Comparators 114, 116 produce low signals when the data fed thereto is different (not equal) and produce a high signal when the data fed thereto is the same (equal).

A recycle/delay circuit 106 is provided to enable retransmission of a received pulse after a predetermined time delay has occurred after the received pulse has been detected. Here the "RECALL" START ADDRESS is the same as the "STORE" START ADDRESS. The RECYCLE/DELAY line is made "high" and the "RECALL" START line "low." The predetermined time delay is entered as a digital word from the control panel 30 to comparator 120 via the DELAY line, as shown. A counter 122 is provided in the recycle/delay circuit 106, the output thereof providing a second input for the comparator 120, as shown. The counter 122 is reset by a control signal on the RESET line. The output of comparator 120 is fed to the AND gate 124 via inverter 125 and to the OR gate 108, as shown. The counter 122 is enabled to count the leading edges of pulses fed to such counter via the MXC line (FIG. 4H) when such counter 122 is enabled by a high signal fed to the enable EN terminal thereof from AND gate 124, as shown. The AND gate 124 is fed by the threshold circuit 26 (FIG. 1), the comparator 120 via inverter 125, and the control panel 30 via a RECYCLE/DELAY line, as shown. Prior to the reception of the incoming pulse, the same address is loaded into the store address counter 90 and the recall address counter 102 in response to "high" signals at the terminals LOAD and $\bar{Q}$ of reset flip/flops 92, 104, respectively. When the pulse is received, flip/flop 92 is reset in response to the theshold signal, and samples of such pulse are stored in sequential addresses, beginning at the "STORE" START ADDRESS until the pulse terminates, i.e., the signal produced at the output threshold circuit 26 here goes "low." Further, with a "high" signal produced on the line RECYCLE/DELAY, and with the contents of counter 122 different from the data on DELAY line (i.e., other than zero) so that the output of comparator 122 is "high" when the pulse is detected, a "high" signal is produced by the AND gate 124, thereby enabling counter 122 to count the leading edges of the pulses on the MXC line. When the counter 122 reaches the count represented by the digital word on the DELAY line, i.e., the predetermined delay, the output of comparator 120 changes from a "low" level to a "high" level, thereby: (1) producing a "low" signal at the output of inverter 125 inhibiting further counting by counter 122; and (2) placing the RECALL flip/flop 104 in a set condition so that the samples of the stored pulse are sequentially recalled and retransmitted, but delayed the predetermined time delay.

In this manner, the threshold circuit provides control signals to operate both the writing addressing circuit system 80 and the recall or read addressing system 82.

Referring again to FIGS. 4A to 4H, and considering the discussion above in connection with FIGS. 3 and 5, it is noted that the leading edge of each pulse on the MXC line indicates the start/stop of a memory cycle. Further, during the first half of such cycle, write addresses are supplied to the RAM's 56a, 56b of memory modules 48a–48d, and during the later half of such cycle read addresses are supplied. A write enable signal is supplied via the R/W line during the time such write addresses are supplied, and a read enable signal is supplied on the R/W line during the time the read address is supplied. Samples are clocked into the input shift register 52 (FIG. 3) in response to clock pulses on line CP/2, and after eight digitized samples are stored, they are transformed in parallel to the holding register 54 in response to the pulses on the ST1 line. The eight samples provide an eight-bit digital word, four bits of which become stored in one of 256 locations of RAM 56a and the other four bits of which become stored in the same one of the 256 locations of RAM 56b, such location being supplied via the ADR bus during the first half of the memory cycle. During the second half of the memory cycle, a read or recall address on the ADR bus addresses one of the 256 locations and, when read, a four bit digital word at the addressed location is coupled to four stages of eight-bit output shift register 58 and a four-bit digital word at the same addressed one of the 256 locations is fed to the other four stages of the eight-bit output shift register 58. The eight bits of data read from RAM's 56a, 56b are loaded into such output shift register 58 at the start/stop of each memory cycle in response to the pulse on the ST2 line and are sequentially read from such shift register during the memory cycle in response to clock pulses fed to such shift register via line CP/2.

Referring now to FIG. 6, the timing unit 29 is shown in detail to include a conventional clock 600 adapted to produce in-phase and out-of-phase clock pulses on the CP line and $\overline{CP}$ line as shown in FIGS. 7A and 7B, respectively. The pulse repetition frequency (PRF) of such pulses is here equal to the bandwidth of the digital RF memory 12 (FIG. 1). i.e., the bandwidth of the RF amplifier 20 (FIG. 1), here 250 MHz. The CP and $\overline{CP}$ lines are coupled to a pair of flip/flops 602, 604, as shown, to produce four series of pulses on the CP/2, $\overline{CP}/$, CP/2+90° and $\overline{CP/2+90°}$ lines, as shown in FIGS. 7C, 7D, 7E and 7F, respectively. It is noted that the pulses on such lines have the same PRF, namely one-half the PRF of the pulses on the CP line. However, the four series of pulses have different phases. That is, if the pulses on the CP/2 line are considered as having a zero phase angle, the pulses on line $\overline{CP}/$ have a 180° phase angle, the pulses on line CP+90° have a 90° phase angle and the pulses on line $\overline{CP/2+90°}$ have a 270° phase angle. Lines CP/2, $\overline{CP}/$, CP/2+90° and $\overline{CP/2+90°}$ are fed to the digital RF memory 12 (FIG. 2) and a pulse generator 606, as shown. Such pulse generator is of any conventional design and includes logic gates, counters, etc., to produce pulses on the ST1 and ST2 lines, the R/W line and the MXC line, such pulses being shown in FIGS. 4C, 4C', 4F and 4H, respectively, and such lines being fed to the digital RF memory 12 (FIG. 2).

Referring again to FIG. 2, it is first noted that the memory modules 48a–48d are each fed by the baseband signal via input line 50, as shown. However, one pair of memory modules, here memory modules 48a, 48b, are fed clocking signals from timing unit 29 (FIG. 6) on the CP/2 and $\overline{CP}/$ lines, whereas the other pair of memory modules 48c, 48d are fed clocking signals from timing unit 29 (FIG. 6) on the CP/2+90° and $\overline{CP/2+90°}$ lines. The clock pulses fed to memory modules 48a, 48b, 48c, 48d on lines CP/2, $\overline{CP}/$, CP/2+90°, and $\overline{CP/2+90°}$, respectively, are shown in FIGS. 7C to 7F, respectively, where 90° represents a one-quarter period delay. While each memory module in the pair stores samples at a rate of CP/2, each pair of modules 48a, 48b (or 48c, 48d) is storing samples at a rate of CP. That is, referring to FIGS. 7C–7D as discussed above in connection with FIG. 3, each memory module stores samples in response to the leading edges of the clock pulses supplied thereto. While the leading edges of the clock pulses on lines CP/2 and $\overline{CP}/$ occur at a rate CP/2, the pair of modules store samples at twice that rate. Therefore, the digital memory 12 is storing samples at, here, an effective sampling frequency of four times the PRF of the pulses on the CP/2 line and, hence, twice the total bandwidth of the digital RF memory 12, i.e. 250 MHz, as shown in FIG. 7G.

The sampling theorem, also known as the Nyquist criterion, states that, if a signal is to be sampled and then reconstructed from these samples, the reconstruction can only be achieved successfully if at least two samples are taken for each cycle of the signal. For example, in order to achieve a 250 GHz instantaneous bandwidth, it is necessary to take at least one sample per two nanoseconds from the baseband RF signal. Hence, because samples are being taken at twice the bandwidth of the digital RF memory 12, the Nyquist criterion is satisfied.

It is noted that the actual sampling rate for each of the four modules 48a–48d is reduced to CP/2. This rate is still several hundred MHz. The sampling process makes use of the fact, here observed, that these digital circuits can successfully extract or sample the state of an input signal with a frequency several times the normal operating bandwidth of the digital circuit if sufficient time is allowed between samples for the circuit to store or transfer these samples internally before being requested to take another sample. In particular, two memory modules 48a, 48b (or 48c, 48d) in each channel alternatively sample the baseband signal in response to 180° out-of-phase clocking signals as discussed above. As a result, the shift times of the two memory modules 48a, 48b (or 48c, 48d) will automatically be displaced by one half-cycle of the clocking signals. While memory modules 48c, 48d also operate with the twin multiplexing arrangement just described, it is noted that the clocking signals fed to such memory modules 48c, 48d are delayed 90°. Therefore, the loading signals $ST1_B$, $ST2_B$; $ST1_C$, $ST2_C$; $ST1_D$, $ST2_D$ are fed to memory modules 48b, 48c and 48d, respectively, as shown in FIG. 2. Such loading signals are produced by the pulse generator 606 (FIG. 6) such that: The pulses and lines $ST1_B$, $ST2_B$ are delayed, here 4 ns., with respect to the pulses on lines ST1, ST2, respectively; the pulses on lines ST1$_C$, ST2$_C$ are delayed, here 2 ns., with respect to the pulses on lines ST1, ST2, respectively; and the pulses on lines ST1$_D$, ST2$_D$ are delayed, here 6 ns., with respect to the pulses on lines ST1, ST2, respectively.

The condition described for the input sampling whereby an array of digital circuits can be arranged to take samples of a signal with a frequency beyond the capability of one individual circuit does not hold for the output multiplex portion of the memory 12 where the outputs of the four memory modules 48a–48d must be combined to reconstruct the original signal. This output multiplexer must have a true bandwidth equal to the effective sampling rate, here 500 MHz, to operate successfully.

The data produced at the outputs of memory modules 48a–48d are combined in a diode multiplexer 210 to produce an output signal on line 212 which is fed to low pass filter 32 (FIG. 1), as shown. Diode multiplexer 210 includes three identically constructed diode ring circuits 214a–214c. Considering diode ring circuit 214a, it is noted that such diode ring circuit 214a includes four diodes 216, 217, 218, 219 serially connected in like polarity, as shown. The anode of diode 216 and the cathode of diode 219 are connected together at a first input terminal 220, as shown. The cathode of diode 217 and the anode of diode 218 are connected together at a second input terminal 222, as shown. Input terminals 220, 222 are connected respectively to output terminals 60a, 60c respectively of memory modules 48a, 48c, as shown. Diode ring circuit 214a includes a pair of output terminals 224, 226. The cathode of diode 218 and the anode of diode 219 are connected to output terminal 224, as shown. The cathode of diode 216 and the anode of diode 217 are connected to output terminal 226, as shown. Output terminals 224, 226 are coupled to the output winding 227 of a balanced transformer 228, as shown, the center tap 229 of such winding 227 being coupled to an output line 230, as shown. The primary winding 232 of such transformer 228 is coupled to clock pulses supplied thereto from the timing unit 29 (FIG. 6) via line CP. It is first noted that the signals fed to input terminals 220, 222 are digital or logical inputs referenced to ground. That is, a logical one read from a memory module is between, say, +1.3 volts and +7 volts, whereas a logical zero signal is less than +1.3 volts but greater than a few tenths of a volt. When the polarity of the clock pulses on line CP (here 250 MHz) is such that output terminal 226 is positive with respect to output terminal 224, then only diodes 217, 218 conduct, connecting the input terminal 222 to the output line 230. However, when output terminal 224 is more positive than output terminal 226, then only diodes 216, 219 conduct, connecting input terminal 220 to output line 230. Thus, on alternative half-cycles of the clock pulses on the CP line, the outputs of memory modules 48a, 48c will alternatively be connected to output line 230, as shown in FIG. 7H. Diodes 216, 217, 218, 219 are integrated Schottky diode mixer quads and provide operation in excess of 10 GHz.

In like manner, the outputs of memory modules 48b, 48c are alternatively coupled to output line 233 of diode ring circuit 214b, as shown in FIG. 7I. Output lines 230, 233 are connected to input terminals 220c, 222c of diode ring circuit 214c, as shown. Output terminals 224c, 226c are connected to the secondary winding of balanced transformer 228c, as shown, while the primary winding 232c is here connected to the CP/2 line, as shown. In response to the clock pulses on the CP/2 line, lines 230, 233 become alternatively connected to output line 212, as shown in FIG. 7J. It follows then, that during the first half of the cycle of the clock pulse signals, the outputs of memory modules 48a, 48c are sequentially coupled to output line 212, and during the second half cycle of the clock pulse signals, the outputs of memory modules 48b, 48d become sequentially coupled to output line 212, as shown in FIG. 7K. That is, referring to FIGS. 7C–7F, it is noted that samples become sequentially stored in memory modules 48a, 48c, 48b, 48d in response to clock pulses CP/2, CP/2+90°, $\overline{CP/}$, and $\overline{CP/2+90°}$, respectively, and samples read or recalled from the digital RF memory 12 appear sequentially on output line 212 from memory modules 48a, 48c, 48d, respectively. Further data is shifted out of the output shift register 58 (FIG. 3) of the memory modules 48a–48d in response to clock signals on lines CP/2, $\overline{CP/}$, CP/2+90°, and $\overline{CP/2+90°}$, respectively.

That is, to put it another way, in response to the leading edges of clocking signals CP/2/, $\overline{CP/}$, CP/2+90°, and $\overline{CP/2+90°}$ fed to memory modules 48a, 48b, 48c, 48d, respectively, as shown in FIGS. 7B, 7C, 7D, 7E, respectively, successive samples become stored in memory modules 48a, 48c, 48b, 48d, respectively. During recall, memory modules 48a, 48c are coupled to line 20 during alternative half-cycles of clock pulses on line CP, as shown in FIG. 7H, and memory modules 48b, 48d become coupled to line 233 during alternative half-cycles of clock pulses on line CP, as shown in FIG. 7I. Memory modules 48a, 48c, 48b, 48d then become sequentially coupled to line 212, as shown in FIG. 7K. Considering that data is produced at the output of the memory modules 48a–48d in response to clocking signals on lines CP/2, $\overline{CP/}$, CP/2+90°, and $\overline{CP/2+90°}$, respectively, it follows (referring also to FIGS. 7C–7F) that, when the samples are recalled, they will appear sequentially on line 230 as they are read sequentially from memories 48a, 48c, 48b, and 48d in response to the clock signals on the CP/2 line.

Having described a preferred embodiment of this invention, it is evident that other embodiments incorporating these concepts may be used. It is felt, therefore, that this invention should not be restricted to the disclosed embodiment but rather should be limited only by the spirit and scope of the appended claims.

What is claimed is:

1. A method for storing digital samples representative of the level of an analog signal comprising the step of feeding the analog signal directly into a digital memory.

2. The method recited in claim 1 wherein the digital memory is a digital shift register and wherein the feeding step comprises feeding the analog signal directly into the digital shift register.

3. A method comprising the steps of:
   (a) feeding an analog signal directly into a digital shift register;
   (b) feeding a train of clock pulses to the shift register; and
   (c) storing a logical signal in the shift register in response to each one of the clock pulses in the train thereof, each stored logical signal having a logical state related to the level of the analog signal at the time said one of the clock pulses is fed to the shift register.

4. A method for storing a series of logical signals in a digital shift register, each one of said logical signals being related to the level of an analog signal at a sampling time comprising the steps of:
   (a) feeding the analog signal directly into the shift register;
   (b) feeding a clock pulse to the shift register at each sampling time; and
   (c) storing one of the series of logical signals in the digital shift register in response to said clock pulse.

5. A method of storing a digital sample of the level of an analog signal characterized in that the analog signal is fed to a digital memory without any intervening analog-to-digital conversion of said analog signal.

6. A method comprising the steps of:
   (a) feeding an analog signal into a digital shift register;
   (b) feeding a train of clock pulses to the shift register; and
   (c) storing a logical signal in the shift register without any intervening analog-to-digital conversion of the analog signal in response to each one of the clock pulses in the train thereof, each stored logical signal having a logical state related to the level of the analog signal at the time said one of the clock pulses is fed to the shift register.

7. A method for storing a digital sample of an analog signal comprising the steps of:
   (a) feeding the analog signal to a digital memory without any analog-to-digital conversion of the analog signal;
   (b) feeding a stored enable signal to the digital memory; and
   (c) storing a digital signal in the digital memory representative of the amplitude of the analog signal at the time the stored enable signal is fed to the digital memory.

8. The method recited in claim 7 wherein the digital memory is a digital shift register.

9. A method comprising the steps of:
   (a) feeding an analog signal having a time varying level to a digital shift register without any intervening analog-to-digital conversion of such analog signal;
   (b) feeding a drain of pulses to the digital shift register, and
   (c) storing a logical signal in the digital shift register in response to each one of the pulses in the train of pulses, each one of the stored logical signals having a logical state relative to the level of the analog signal at the time said one of the pulses is fed to the digital shift register.

* * * * *